United States Patent
Gourley et al.

(10) Patent No.: US 6,229,378 B1
(45) Date of Patent: *May 8, 2001

(54) USING PROGRAMMABLE JUMPERS TO SET AN IC DEVICE'S BIT-ENCODED OUTPUT DURING MANUFACTURING AND TESTING

(75) Inventors: Tom Gourley, Bank, OR (US); Borys Senyk, San Jose, CA (US)

(73) Assignee: Intel Corporation, Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/001,310

(22) Filed: Dec. 31, 1997

(51) Int. Cl.[7] ............................................. H01H 37/76
(52) U.S. Cl. ........................... 327/525; 257/48; 324/763
(58) Field of Search ........................... 327/525, 526; 365/96; 438/467, 600, 601; 257/48; 324/537, 763, 765, 158.1; 326/37, 38

(56) References Cited

U.S. PATENT DOCUMENTS

| | | | |
|---|---|---|---|
| 4,030,793 | | 6/1977 | Hanlon et al. ................. 339/18 C |
| 4,354,217 | * | 10/1982 | Mahon ................................ 361/104 |
| 4,608,530 | * | 8/1986 | Bacrania ............................ 323/315 |
| 4,613,959 | * | 9/1986 | Jiang .................................. 365/200 |
| 4,758,745 | | 7/1988 | Elgamal et al. ..................... 326/41 |
| 5,014,002 | | 5/1991 | Wiscombe et al. ................. 324/158 |
| 5,345,110 | * | 9/1994 | Renfro et al. ..................... 327/199 |
| 5,412,593 | * | 5/1995 | Mangel et al. ...................... 365/96 |
| 5,424,672 | * | 6/1995 | Cowles et al. ..................... 327/525 |
| 5,442,598 | * | 8/1995 | Haikawa et al. .................... 369/32 |
| 5,583,819 | * | 12/1996 | Roesner et al. ................. 365/225.7 |
| 5,631,578 | | 5/1997 | Clinton et al. ..................... 326/41 |
| 5,652,524 | * | 7/1997 | Jennion et al. ..................... 324/765 |
| 5,677,884 | * | 10/1997 | Zagar et al. ....................... 365/200 |
| 5,751,151 | * | 5/1998 | Levy et al. ......................... 324/537 |
| 5,847,987 | * | 12/1998 | Cutter ................................. 365/96 |

* cited by examiner

Primary Examiner—Kenneth B. Wells
Assistant Examiner—Hai L. Nguyen
(74) Attorney, Agent, or Firm—Blakely, Sokoloff, Taylor & Zafman LLP

(57) ABSTRACT

A programmable interface between an IC device and a circuit device is provided, the programmable interface having a bit-encoded output. The programmable interface includes a reference voltage contact and a connection to the circuit device. The connection to the circuit device is associated with the bit-encoded output. The programmable interface also includes a programmable jumper connected between the reference voltage contact and the connection to the circuit device.

22 Claims, 12 Drawing Sheets

USING PROGRAMMABLE JUMPERS TO SET AN IC DEVICE'S BIT-ENCODED OUTPUT DURING MANUFACTURING AND TESTING

BACKGROUND OF THE INVENTION

1. Field of the Invention

This invention relates generally to manufacturing and testing integrated circuits and integrated circuit devices, and, in particular, to programmable jumpers used during integrated circuit and integrated circuit device manufacturing and testing.

2. Description of the Related Art

Integrated circuit (IC) processors typically must be programmed, during manufacturing and testing, with Voltage ID (VID) information needed to drive the IC processor's core voltage regulator to the correct voltage output. For example, this VID information may consist of 4 bits on the IC processor's interface cartridge, such as the mobile cartridge for the Intel® Pentium ®II microprocessor. The required voltage regulator response to the electrical state of the VID bits is usually previously defined in the IC processor's Equipment Manufacturer Technical Specification (EMTS). The VID bits are output from the IC processor's interface cartridge to the Original Equipment Manufacturer's (OEM's) voltage regulator circuit. Each VID bit is either shorted to Vss (Ground) or left open on the IC processor's interface cartridge. While the EMTS typically specifies the voltage regulator response for each of the sixteen ($2_4$) possible VID bit combinations, the EMTS typically does not specify any mechanism for setting the VID bits on the IC processor's interface cartridge since the setting of the VID bit values is immaterial to the OEM.

One of the conventional methods to set the VID bits on a IC processor's interface cartridge is to solder a 0 Ω resistor from each VID bit's signal line to Vss whenever the VID bit is required to be a logical or binary zero ("0"). For VID bits that are to be set to a logical or binary one ("1"), no 0 Ω resistor is used. Each VID bit's signal line may or may not have an associated 0 Ω resistor that may or may not be soldered in when the IC processor's interface cartridge is manufactured. These 0 Ω resistors must then be specified as "stuffed" or "not stuffed" into the IC processor's interface cartridge in the bill of materials (BOM) prior to assembly of the IC processor and the IC processor's associated interface cartridge.

For mobile IC processors, particularly, as the IC processor core silicon matures, the core voltage requirements may change. Typically, the core voltage requirements go down in value, reducing the power consumed by the IC processor core. If the IC processor's associated interface cartridge uses 0 Ω resistors to define the VID bits, any change in the IC processor core voltage requirements would require generation of a new BOM, new assembly number, new pick and place manual programming and soldering of new 0 Ω resistors to define the new VID bits and new In-Circuit Test programming, and the like. In addition, it may be desirable to test the IC processor to determine the optimal IC processor core voltage. If the IC processor's associated interface cartridge uses 0 Ω resistors to define the VID bits, the 0 Ω resistors would have to be stuffed or modified and soldered or removed after the testing, adding considerably to the cost and complexity of the manufacturing process and reducing throughput.

The present invention is directed to overcoming, or at least reducing the effects of, one or more of the problems set forth above.

SUMMARY OF INVENTION

In one aspect of the present invention, a programmable interface between an IC device and a circuit device is provided, the programmable interface having a bit-encoded output. The programmable interface includes a reference voltage contact and a connection to the circuit device. The connection to the circuit device is associated with the bit-encoded output. The programmable interface also includes a programmable jumper connected between the reference voltage contact and the connection to the circuit device.

In another aspect of the present invention, a method of programming a bit-encoded output for an IC device having such a programmable interface is provided. In yet another aspect of the present invention, a device including such an IC device and a programmable interface is provided. In still another aspect of the present invention, a method of programming such a device including an IC device and a programmable interface is provided.

BRIEF DESCRIPTION OF THE DRAWINGS

Other objects and advantages of the invention will become apparent upon reading the following detailed description and upon reference to the drawings in which.

Figure 1:
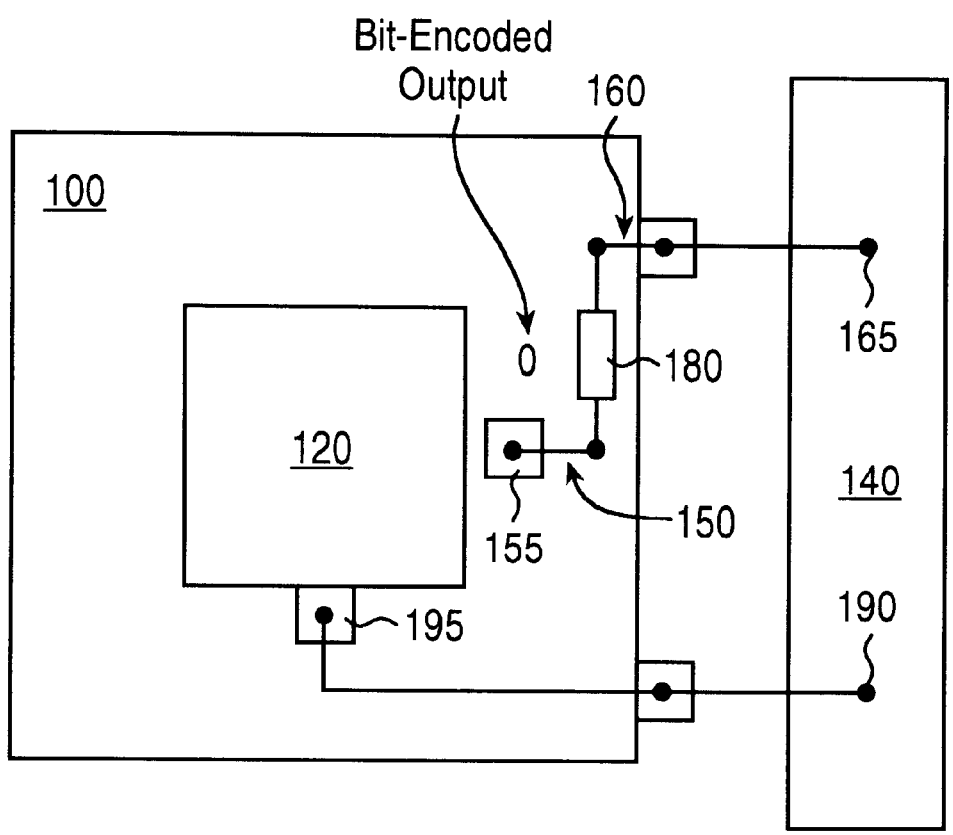
FIG. 1 is a schematic illustration of a first embodiment of the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, that will vary from one implementation to another. Moreover, it will be appreciated that such a development effort might be complex and time-consuming, but would nevertheless be a routine undertaking for those of ordinary skill in the art having the benefit of this disclosure.

Turning now to the drawings, and in particular to FIG. 1, a first embodiment of the present invention is schematically illustrated. An interface cartridge 100 has an IC device 120, such as an IC microprocessor, for example, removably mounted thereon. The interface cartridge 100 connects the IC device 120 to a circuit device 140, such as a voltage regulator circuit for an IC microprocessor, for example. The interface cartridge 100 provides a connection 150 to a reference voltage contact 155 on the interface cartridge 100, such as a Vss (ground) contact, for example.

The interface cartridge 100 provides a connection 160 to an input pin or lead or contact 165 of the circuit device 140, such as the voltage ID (VID) pin or lead or contact for a voltage regulator circuit for an IC microprocessor, for example. The circuit device 140 receives, through the input contact 165, the bit-encoded output that is output from the interface cartridge 100, such as the logical or binary "0" as shown in FIG. 1. The logical or binary "0" corresponds to a predetermined or preselected signal, such as, "The core voltage requirement for this IC microprocessor is 5.0 volts," being output from the VID output pin of the interface cartridge of the IC microprocessor to the VID input pin of the voltage regulator circuit regulating the voltage input to the IC microprocessor, for example.

The interface cartridge 100 generates, through the reference voltage contact 155, the bit-encoded output that is output to the circuit device 140, such as the logical or binary "0" as shown in FIG. 1. The bit-encoded output leads to a predetermined or preselected response from the circuit device 140, such as a voltage regulator response from a voltage regulator circuit for an IC microprocessor, for example. The response is output from a pin or lead or contact 190 of the circuit device 140 and is input to a pin or lead or contact 195 of the IC device 120.

A programmable jumper 180 is connected between the connections 150 and 160 of the interface cartridge 100. The programmable jumper 180 may be an electrically fusible component soldered down on the interface cartridge 100 substrate during the manufacturing process. For example, the programmable jumper 180 may be similar in size and shape to surface mount 0603 body resistors and capacitors. For example, 0.0625 W surface mount resistors (0603) available from NTE Electronics, Inc. (SR1-0603-000 through SR1-0603-610) have bodies that are 0.061 in (1.55 mm) long, 0.031 in (0.80 mm) wide and 0.016 in (0.40 mm) thick, and have terminal widths of 0.010 in (0.25 mm). No special equipment may be needed to handle such a programmable jumper 180. The programmable jumper 180 may be designed into the substrate of the interface cartridge 100 in the same manner as a surface mount resistor, such as a surface mount 0603 body resistor, for example. Such a programmable jumper 180, as an electrically fusible component, may maintain an electrical connection between the connections 150 and 160, much like a 0 Ω resistor would, if the 0 Ω resistor were connected between the connections 150 and 160, for example.

Figure 2:
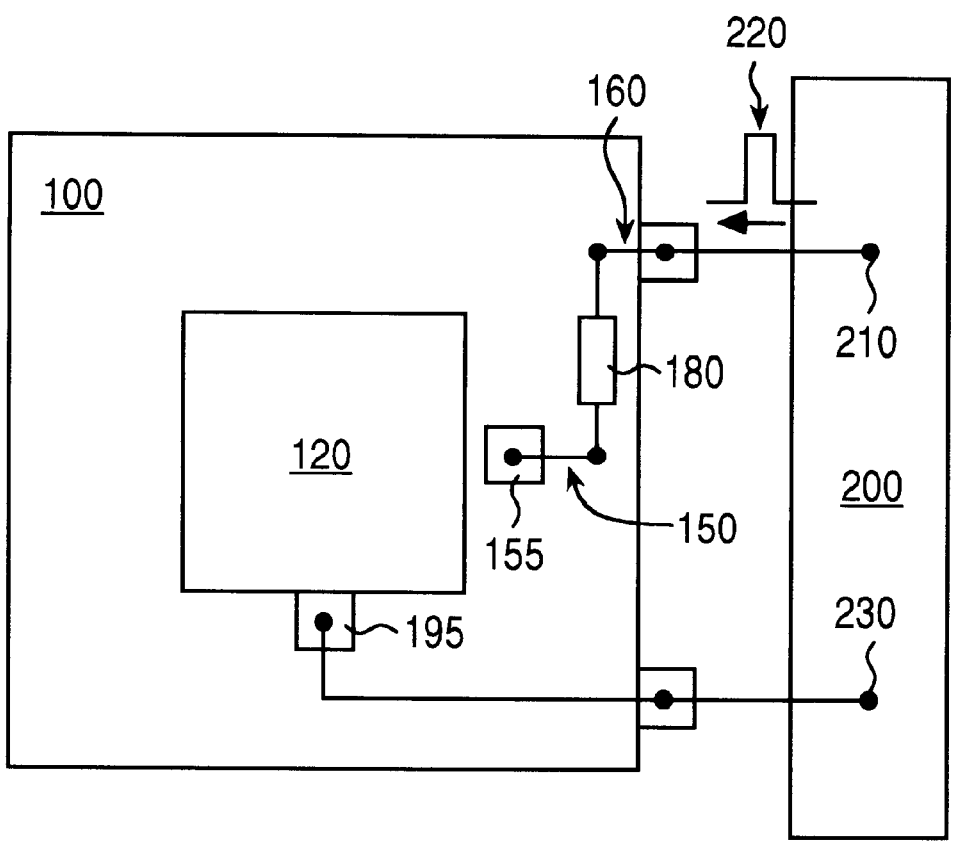
FIG. 2 is a schematic illustration of programming for the first embodiment as shown in FIG. 1, according to the present invention.

Turning now to FIG. 2, a schematic illustration is shown of the programming for the first embodiment as shown in FIG. 1, according to the present invention. The connection 160 of the interface cartridge 100 is connected to a testing circuit 200 through a pin or lead or contact 210, as shown in FIG. 2. In order to program the programmable jumper 180 of the interface cartridge 100, if the bit-encoded output generated by the IC device 120 is to be changed from the logical or binary "0" as shown in FIG. 1, a current pulse 220 is output from the testing circuit 200 through the contact 210, as indicated schematically by the arrow in FIG. 2. Provided the current pulse 220 is sufficiently high in magnitude and sufficiently long in duration, the fusible component of the programmable jumper 180 breaks or opens the circuit, and the programmable jumper 180 is in the state corresponding to a bit-encoded output of a logical or binary "1" as indicated schematically in FIG. 3. For example, a current about twice as large as the current-carrying capacity of the programmable jumper 180 may suffice. The testing circuit 200 may also be connected to the IC device 120 through a pin or lead or contact 230 to the pin or lead or contact 195 of the IC device, as shown in FIG. 2.

Figure 3:
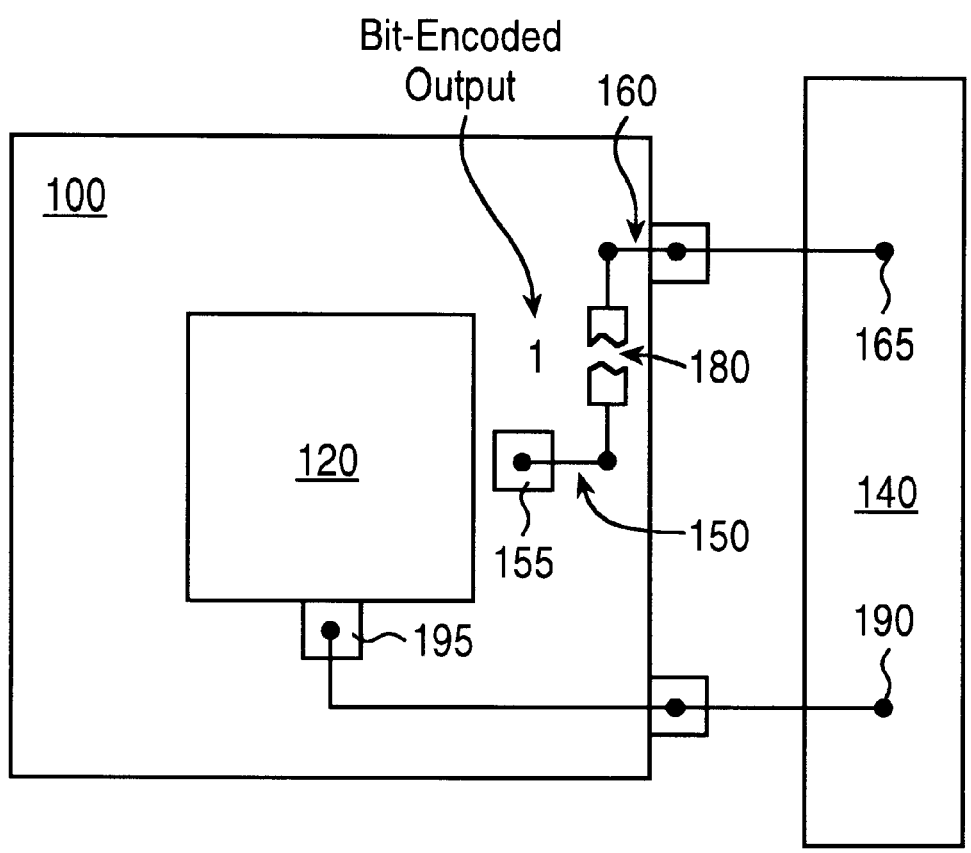
FIG. 3 is a schematic illustration of one possible outcome for the first embodiment as shown in FIG. 1, following the programming as shown in FIG. 2.

A break in the programmable jumper 180 as shown in FIG. 3 breaks the circuit connecting the input contact 165 of the circuit device 140, through the corresponding connection 160 of the interface cartridge 100, to the reference voltage contact 155 of the interface cartridge 100, through the associated connection 150 of the interface cartridge 100. The break in the circuit corresponds to the respective bit-encoded output, such as the logical or binary "1" as shown in FIG. 3. A logical or binary "1" corresponds to a predetermined or preselected signal, such as, "The core voltage requirement for this IC microprocessor is 3.3 volts," being output from the VID output pin of the interface cartridge of the IC microprocessor to the VID input pin of the voltage regulator circuit regulating the voltage input to the IC microprocessor, for example. As discussed above, the bit-encoded output may lead to a predetermined or preselected response from the circuit device 140, such as a voltage regulator response from a voltage regulator circuit for an IC microprocessor, for example. Again, the response may be output from a pin or lead or contact 190 of the circuit device 140 and may be input to a pin or lead or contact 195 of the IC device 120.

If the bit-encoded output generated by the IC device 120 is not to be changed from the logical or binary "0" as shown in FIG. 1, a current pulse 220 may still be output from the testing circuit 200 through the contact 210, as indicated schematically by the arrow in FIG. 2. Provided the current pulse 220 is sufficiently low in magnitude and sufficiently short in duration, the fusible component of the programmable jumper 180 may not break or open the circuit, and the programmable jumper 180 may remain in the state corresponding to the bit-encoded output of a logical or binary "0" as indicated schematically in FIG. 1. For example, a current less than about half the current-carrying capacity of the programmable jumper 180 may suffice.

Alternatively, in order to program the programmable jumper 180 of the interface cartridge 100, if the bit-encoded output generated by the IC device 120 is not to be changed from the logical or binary "0" as shown in FIG. 1, a current pulse 220 may not need to be output from the testing circuit 200 through the contact 210. In either case, if the current pulse 220 output from the testing circuit 200 is sufficiently low in magnitude and sufficiently short in duration or if no current pulse 220 is output from the testing circuit 200, the programmable jumper 180, as an electrically fusible component, may continue maintaining an electrical connection between the connections 150 and 160, much like a 0 Ω resistor would, if the 0 Ω resistor were connected between the connections 150 and 160, for example.

Figure 4:
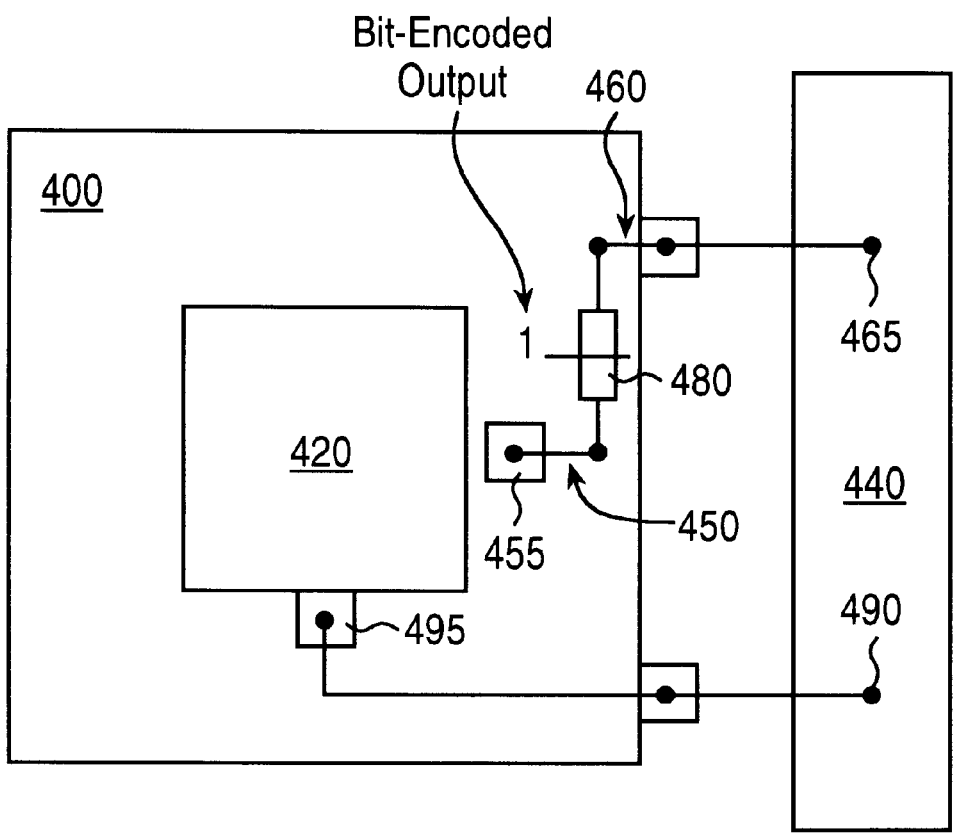
FIG. 4 is a schematic illustration of a second embodiment of the present invention.

Turning now to FIG. 4, a second embodiment of the present invention is schematically illustrated. An interface cartridge 400 has an IC device 420, such as an IC microprocessor, for example, removably mounted thereon. The interface cartridge 400 connects the IC device 420 to a circuit device 440, such as a voltage regulator circuit for an IC microprocessor, for example. The interface cartridge 400 provides a connection 450 to a reference voltage contact 455 on the interface cartridge 400, such as a Vss (ground) contact, for example.

The interface cartridge 400 provides a connection 460 to an input pin or lead or contact 465 of the circuit device 440, such as the voltage ID (VID) pin or lead or contact for a voltage regulator circuit for an IC microprocessor, for example. The circuit device 440 receives, through the input contact 465, the bit-encoded output that is output from the interface cartridge 400, such as the logical or binary "1" as shown in FIG. 4. The logical or binary "1" corresponds to a predetermined or preselected signal, such as, "The core voltage requirement for this IC microprocessor is 5.0 volts," being output from the VID output pin of the interface cartridge of the IC microprocessor to the VID input pin of the voltage regulator circuit regulating the voltage input to the IC microprocessor, for example.

The interface cartridge 400 generates, through the reference voltage contact 455, the bit-encoded output that is output to the circuit device 440, such as the logical or binary "1" as shown in FIG. 4. The bit-encoded output leads to a predetermined or preselected response from the circuit device 440, such as a voltage regulator response from a voltage regulator circuit for an IC microprocessor, for example. The response is output from a pin or lead or contact 490 of the circuit device 440 and is input to a pin or lead or contact 495 of the IC device 420.

A programmable jumper 480 is connected between the connections 450 and 460 of the interface cartridge 400. The programmable jumper 480 may be an electrical antifuse component soldered down on the interface cartridge 400 substrate during the manufacturing process. For example, the programmable jumper 480 may be similar in size and shape to surface mount 0603 body resistors and capacitors. No special equipment may be needed to handle such a programmable jumper 480. The programmable jumper 480 may be designed into the substrate of the interface cartridge 400 in the same manner as a surface mount resistor, such as a surface mount 0603 body resistor, for example. Such a programmable jumper 480, as an electrical antifuse component, may inhibit or prevent an electrical connection between the connections 450 and 460, much like having a break in the circuit would, if the break in the circuit were between the connections 450 and 460, for example.

Figure 5:
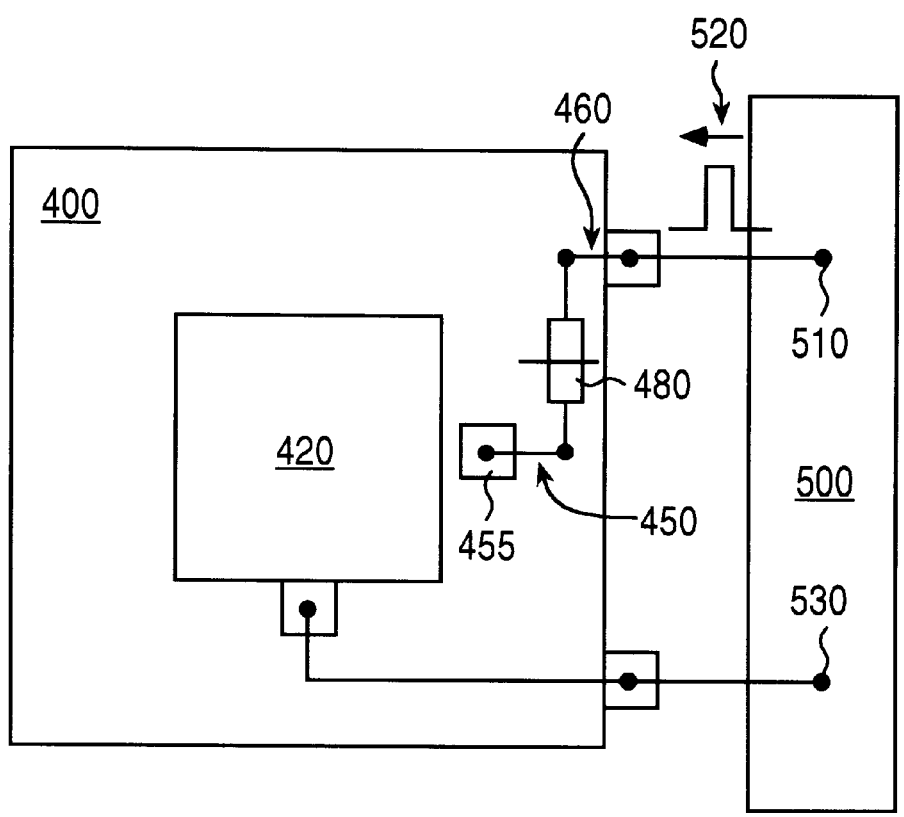
FIG. 5 is a schematic illustration of programming for the second embodiment as shown in FIG. 4, according to the present invention.

Turning now to FIG. 5, a schematic illustration is shown of the programming for the first embodiment as shown in FIG. 4, according to the present invention. The connection 460 of the interface cartridge 400 is connected to a testing circuit 500 through a pin or lead or contact 510, as shown in FIG. 5. In order to program the programmable jumper 480 of the interface cartridge 400, if the bit-encoded output generated by the IC device 420 is to be changed from the logical or binary "1" as shown in FIG. 4, a current pulse 520 is output from the testing circuit 500 through the contact 510, as indicated schematically by the arrow in FIG. 5. Provided the current pulse 520 is sufficiently high in magnitude and sufficiently long in duration, the antifusible component of the programmable jumper 480 establishes or closes the circuit, and the programmable jumper 480 is in the state corresponding to a bit-encoded output of a logical or binary "0" as indicated schematically in FIG. 6. For example, a current about twice as large as the current-creating value of the programmable jumper 480 may suffice. The testing circuit 500 may also be connected to the IC device 420 through a pin or lead or contact 530 to the pin or lead or contact 495 of the IC device, as shown in FIG. 5.

Figure 6:
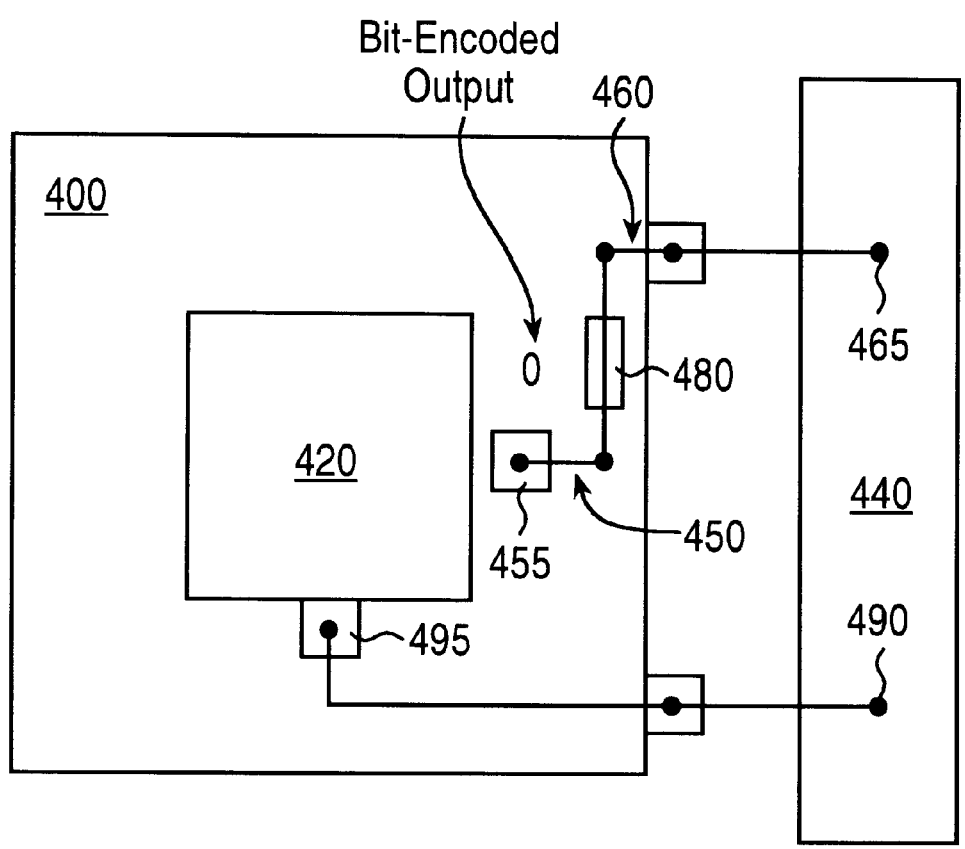
FIG. 6 is a schematic illustration of one possible outcome for the second embodiment as shown in FIG. 4, following the programming as shown in FIG. 5.

The antifusing in the programmable jumper 480 as shown in FIG. 6 closes the circuit connecting the input contact 465 of the circuit device 440, through the corresponding connection 460 of the interface cartridge 400, to the reference voltage contact 455 of the interface cartridge 400, through the associated connection 450 of the interface cartridge 400. The closing of the circuit corresponds to the respective bit-encoded output, such as the logical or binary "0" as shown in FIG. 6. A logical or binary "0" corresponds to a predetermined or preselected signal, such as, "The core voltage requirement for this IC microprocessor is 3.3 volts," being output from the VID output pin of the interface cartridge of the IC microprocessor to the VID input pin of the voltage regulator circuit regulating the voltage input to the IC microprocessor, for example. As discussed above, the bit-encoded output may lead to a predetermined or preselected response from the circuit device 440, such as a voltage regulator response from a voltage regulator circuit for an IC microprocessor, for example. Again, the response may be output from a pin or lead or contact 490 of the circuit device 440 and may be input to a pin or lead or contact 495 of the IC device 420.

If the bit-encoded output generated by the IC device 420 is not to be changed from the logical or binary "1" as shown in FIG. 4, a current pulse 520 may still be output from the testing circuit 500 through the contact 510, as indicated schematically by the arrow in FIG. 5. Provided the current pulse 520 is sufficiently low in magnitude and sufficiently short in duration, the antifuse component of the programmable jumper 480 may fail to establish or close the circuit, and the programmable jumper 480 may remain in the state corresponding to a bit-encoded output of a logical or binary "1" as indicated schematically in FIG. 4. For example, a current less than about half the current-creating value of the programmable jumper 480 may suffice.

Alternatively, in order to program the programmable jumper 480 of the interface cartridge 400, if the bit-encoded output generated by the IC device 420 is not to be changed from the logical or binary "1" as shown in FIG. 4, a current pulse 520 may not need to be output from the testing circuit 500 through the contact 510. In either case, if the current pulse 520 output from the testing circuit 500 is sufficiently low in magnitude and sufficiently short in duration or if no current pulse 520 is output from the testing circuit 500, the programmable jumper 480, as an electrical antifuse component, may continue inhibiting or preventing an electrical connection between the connections 450 and 460, much like having a break in the circuit would, if the break in the circuit were between the connections 450 and 460, for example.

Figure 7:
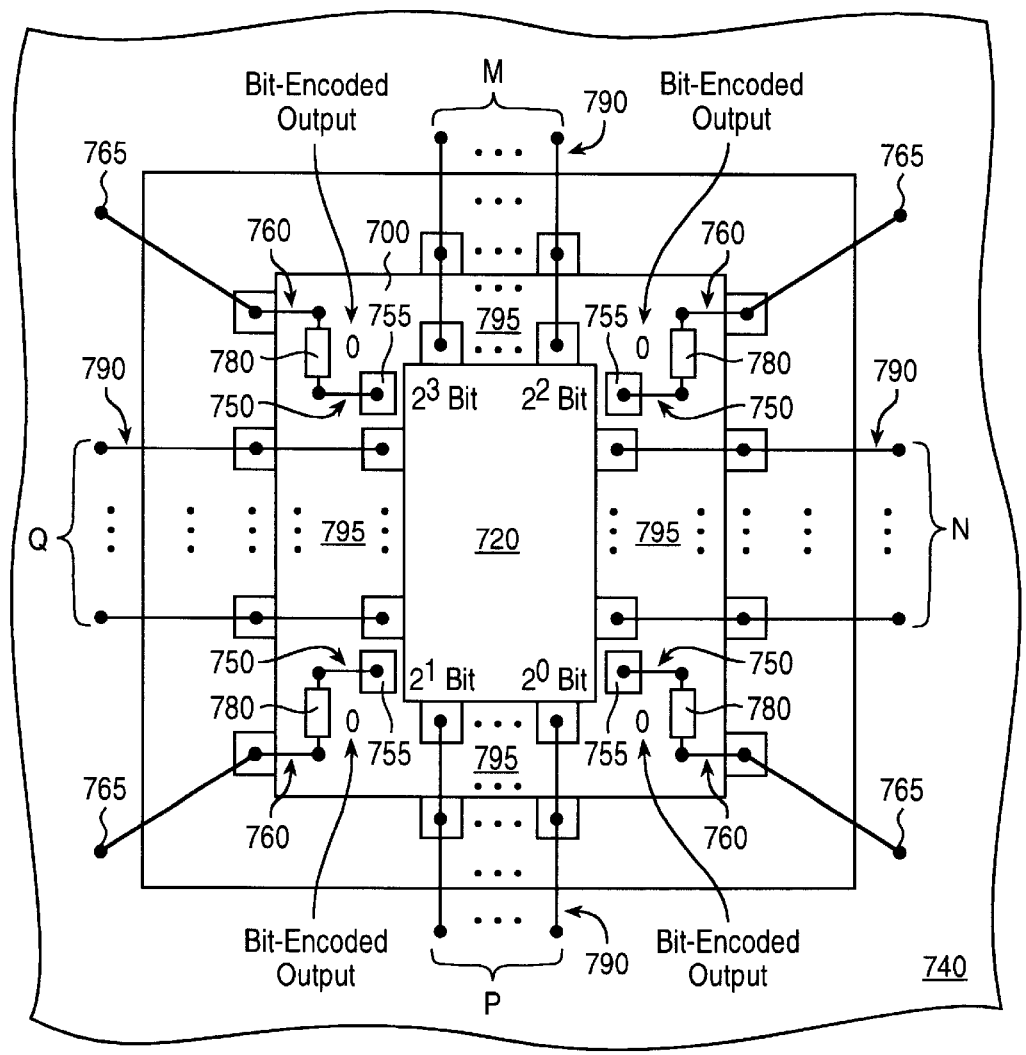
FIG. 7 is a schematic illustration of a third embodiment of the present invention.

Turning now to FIG. 7, a third embodiment of the present invention is schematically illustrated. An interface cartridge 700 has an IC device 720, such as an IC microprocessor, for example, removably mounted thereon. The interface cartridge 700 connects the IC device 720 to a circuit device 740, such as a voltage regulator circuit for an IC microprocessor, for example. The interface cartridge 700 provides several connections 750 to respective reference voltage contacts 755 on the interface cartridge 700, such as Vss (ground) contacts, for example.

The interface cartridge 700 provides several connections 760 to respective input pins or leads or contacts 765 of the circuit device 740, such as the four voltage ID (VID) pins or leads or contacts for a voltage regulator circuit for an IC microprocessor, for example. The circuit device 740 receives, through the input contacts 765, the bit-encoded output that is output from the interface cartridge 700, such as the logical or binary "0000" as shown in FIG. 7 (reading from left to right and from top to bottom around the IC device 720, starting at the upper left corner for the $2^3$ bit position output, going to the upper right corner for the $2^2$ bit position output, then to the lower left corner for the $2^1$ bit position output and finishing at the lower right corner for the $2^0$ bit position output). With 4 bits, for example, the bit-encoded output may have any one of $16=2^4$ possible values n, ranging from the logical or binary "0000" (corresponding to n=0) to the logical or binary "1111" (corresponding to n=15). Each value of n may correspond to a predetermined or preselected signal, such as, "The core voltage requirement for this IC microprocessor is 5.0000−n(0.3125) volts," being output from the VID output pins of the interface cartridge of the IC microprocessor to the VID input pins of the voltage regulator circuit regulating the voltage input to the IC microprocessor, for example. If n=0 (corresponding to the logical or binary "0000"), for example, the associated bit-encoded output may correspond to the predetermined or preselected signal, "The core voltage requirement for this IC microprocessor is 5.0000=5.0000−0(0.3125) volts," being output from the VID output pins of the interface cartridge.

The interface cartridge 700 generates, through the reference voltage contacts 755, the bit-encoded output that is output to the circuit device 740, such as the logical or binary "0000" as shown in FIG. 7. The bit-encoded output leads to a predetermined or preselected response from the circuit device 740, such as a voltage regulator response from a voltage regulator circuit for an IC microprocessor, for example. The response may be output from any one of the M+N+P+Q pins or leads or contacts 790 of the circuit device 740 and may be input to any one of the M+N+P+Q pins or leads or contacts 795 of the IC device 720.

Programmable jumpers 780 are connected between the respective connections 750 and 760 of the interface cartridge 700. The programmable jumpers 780 may be electrically fusible components soldered down on the interface cartridge 700 substrate during the manufacturing process. For example, the programmable jumpers 780 may be similar in size and shape to surface mount 0603 body resistors and capacitors. No special equipment may be needed to handle such a programmable jumper 780. The programmable jumpers 780 may be designed into the substrate of the interface cartridge 700 in the same manner as surface mount resistors, such as surface mount 0603 body resistors, for example. Such programmable jumpers 780, as electrically fusible components, may maintain electrical connections between the respective connections 750 and 760, much like 0 Ω resistors would, if the 0 Ω resistors were connected between the respective connections 750 and 760, for example.

Figure 8:
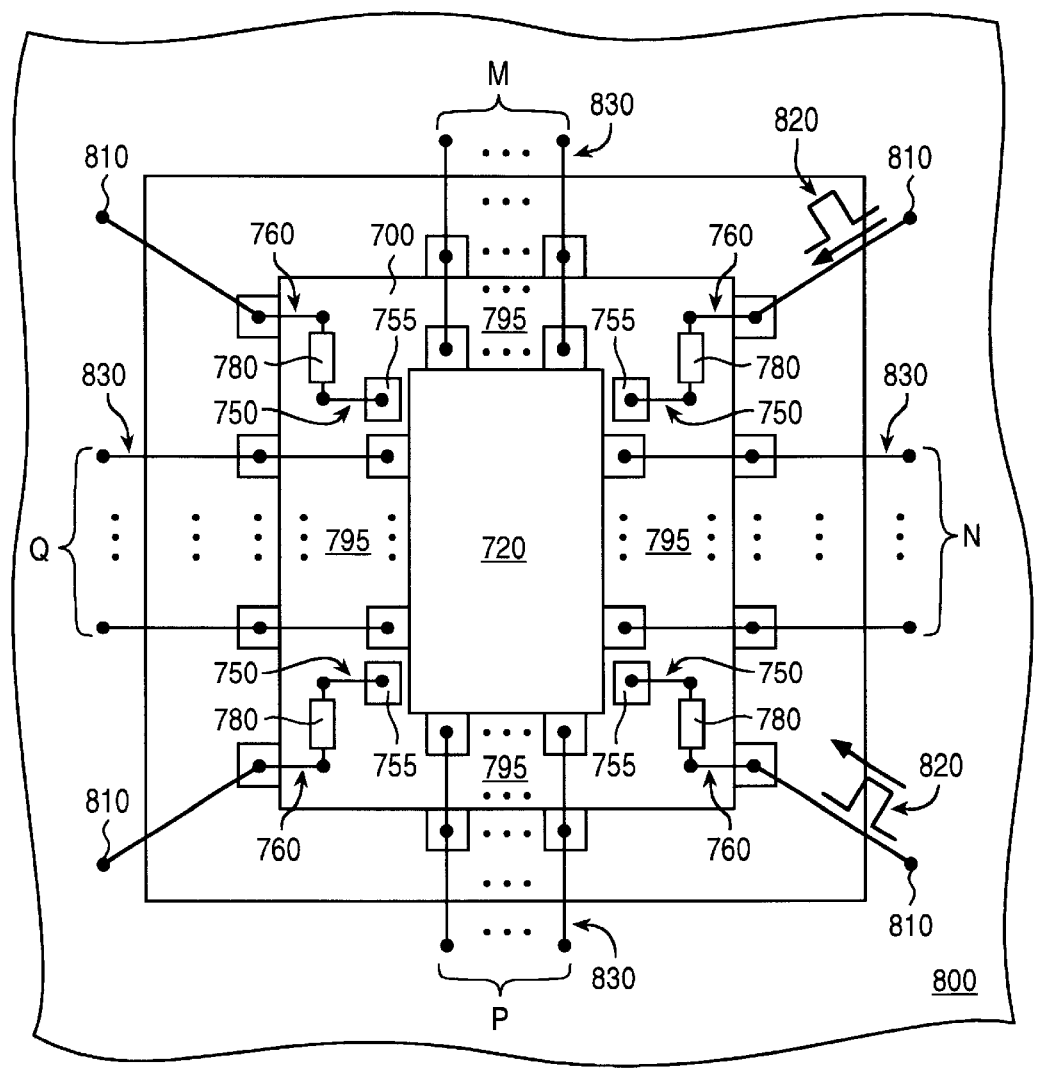
FIG. 8 is a schematic illustration of programming for the third embodiment as shown in FIG. 7, according to the present invention.

Turning now to FIG. 8, a schematic illustration is shown of the programming for the first embodiment as shown in FIG. 7, according to the present invention. The connection 760 of the interface cartridge 700 is connected to a testing circuit 800 through a pin or lead or contact 810, as shown in FIG. 8. In order to program the programmable jumpers 780 of the interface cartridge 700, if the bit-encoded output generated by the IC device 720 is to be changed from the logical or binary "0000" as shown in FIG. 7, appropriate current pulses 820 are output from the testing circuit 800 through the contacts 810, as indicated schematically by the arrows in FIG. 8. Provided the current pulses 820 are sufficiently high in magnitude and sufficiently long in duration, the fusible components of the programmable jumpers 780 break or open the circuits, and the programmable jumpers 780 are in the state corresponding to a bit-encoded output of a logical or binary "0101" as indicated schematically in FIG. 9 (reading from left to right and from top to bottom around the IC device 720). For example, a current about twice as large as the current-carrying capacity of the programmable jumpers 780 may suffice. The testing circuit 800 may also be connected to the IC device 720 through the M+N+P+Q pins or leads or contacts 830 to respective ones of the M+N+P+Q pins or leads or contacts 795 of the IC device, as shown in FIG. 8.

Figure 9:
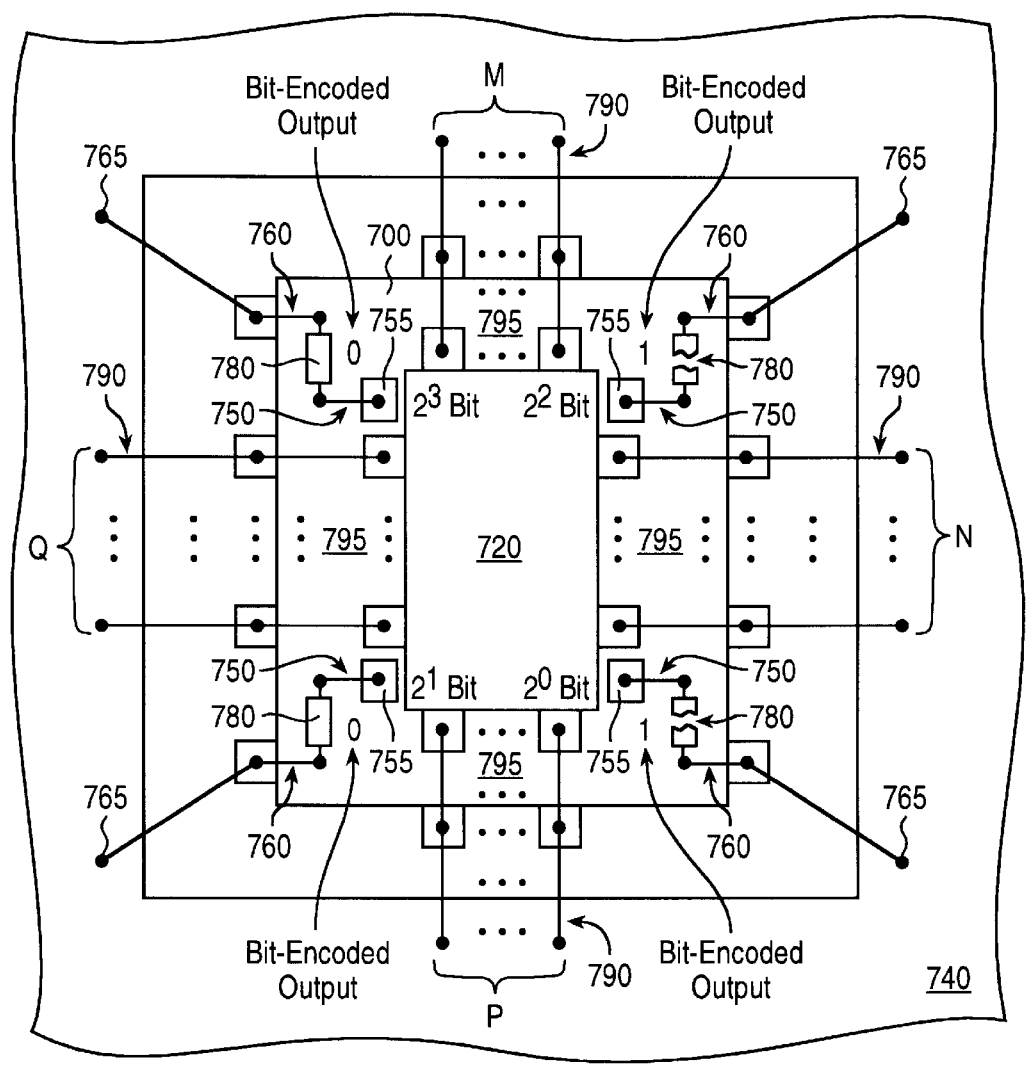
FIG. 9 is a schematic illustration of one possible outcome for the third embodiment as shown in FIG. 7, following the programming as shown in FIG. 8.

Breaks in the programmable jumpers 780 as shown in FIG. 9 break the circuits connecting the input contacts 765 of the circuit device 740, through the corresponding connections 760 of the interface cartridge 700, to the respective reference voltage contacts 755 of the interface cartridge 700, through the associated connections 750 of the interface cartridge 700. The breaks in the circuits correspond to the respective bit-encoded output, such as the logical or binary "0101" (corresponding to n=5) as shown in FIG. 9. As discussed above, each value of n may correspond to a predetermined or preselected signal, such as, "The core voltage requirement for this IC microprocessor is 5.0000−n(0.3125) volts," being output from the VID output pins of the interface cartridge of the IC microprocessor to the VID input pins of the voltage regulator circuit regulating the voltage input to the IC microprocessor, for example. If n=5 (corresponding to the logical or binary "0101"), for example, the associated bit-encoded output may correspond to the predetermined or preselected signal, "The core voltage requirement for this IC microprocessor is 3.4375=5.0000−5(0.3125) volts," being output from the VID output pins of the interface cartridge.

If the bit-encoded output generated by the IC device 720 is not to be changed from the logical or binary "0000" (corresponding to n=0) as shown in FIG. 7, current pulses 820 may still be output from the testing circuit 800 through the respective contacts 810, as indicated schematically by the arrows in FIG. 8. Provided the current pulses 820 are sufficiently low in magnitude and sufficiently short in duration, the fusible components of the programmable jumpers 780 may not break or open the circuits, and the programmable jumpers 780 may remain in the state corresponding to the bit-encoded output of a logical or binary "0000" (corresponding to n=0) as indicated schematically in FIG. 7. For example, a current less than about half the current-carrying capacity of the programmable jumpers 780 may suffice.

Alternatively, in order to program the programmable jumpers 780 of the interface cartridge 700, if the bit-encoded output generated by the IC device 720 is not to be changed from the logical or binary "0000" (corresponding to n=0) as shown in FIG. 7, current pulses 820 may not need to be output from the testing circuit 800 through the contacts 810. In either case, if the current pulses 820 output from the testing circuit 800 are sufficiently low in magnitude and sufficiently short in duration or if no current pulses 820 are output from the testing circuit 800, the programmable jumpers 780, as electrically fusible components, may continue maintaining electrical connections between the respective connections 750 and 760, much like 0 Ω resistors would, if the 0 Ω resistors were connected between the respective connections 750 and 760, for example.

Figure 10:
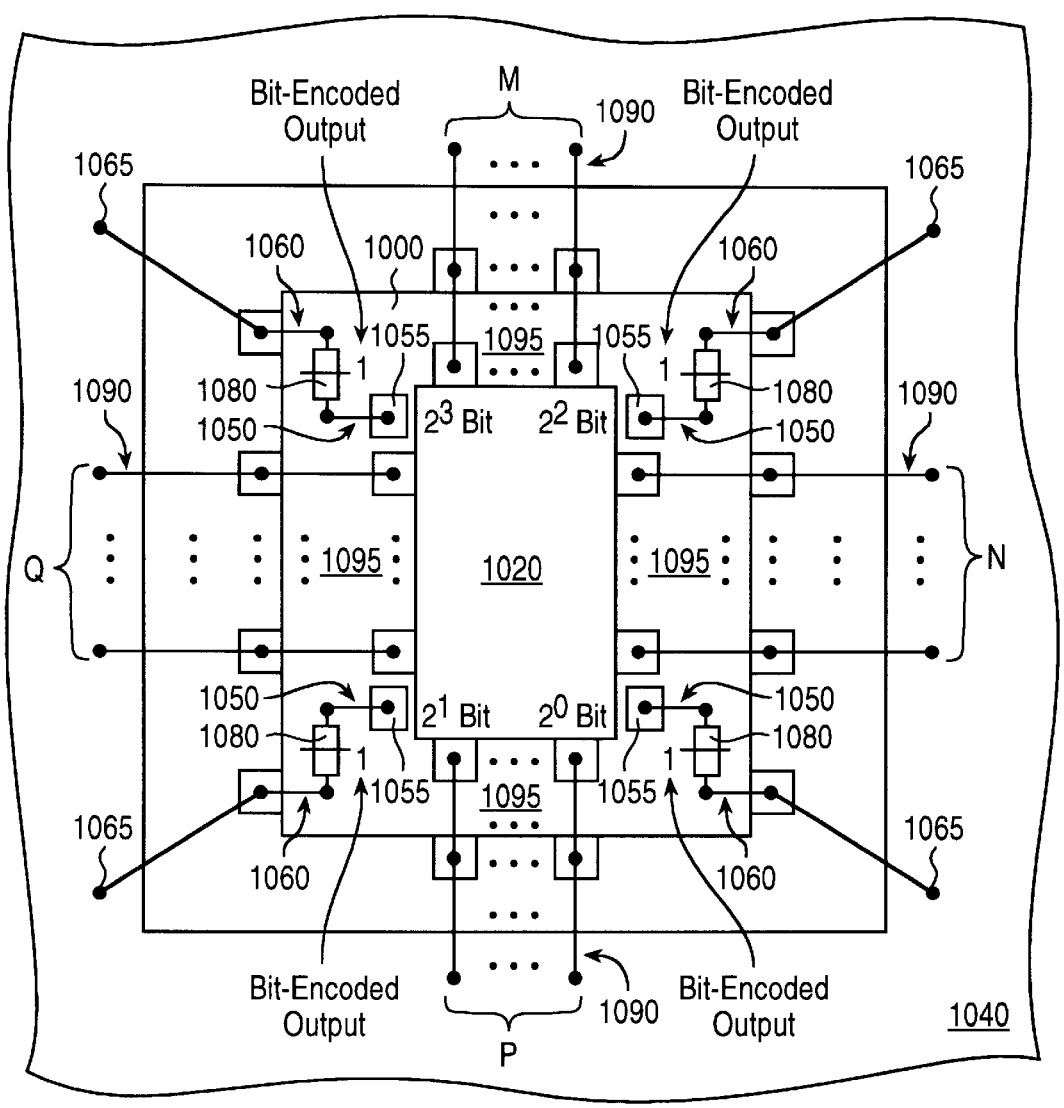
FIG. 10 is a schematic illustration of a fourth embodiment of the present invention.

Turning now to FIG. 10, a fourth embodiment of the present invention is schematically illustrated. An interface cartridge 1000 has an IC device 1020, such as an IC microprocessor, for example, removably mounted thereon. The interface cartridge 1000 connects the IC device 1020 to a circuit device 1040, such as a voltage regulator circuit for an IC microprocessor, for example. The interface cartridge 1000 provides several connections 1050 to respective reference voltage contacts 1055 on the interface cartridge 1000, such as Vss (ground) contacts, for example.

The interface cartridge 1000 provides several connections 1060 to respective input pins or leads or contacts 1065 of the circuit device 1040, such as the four voltage ID (VID) pins or leads or contacts for a voltage regulator circuit for an IC microprocessor, for example. The circuit device 1040 receives, through the input contacts 1065, the bit-encoded output that is output from the interface cartridge 1000, such as the logical or binary "1111" as shown in FIG. 10 (reading from left to right and from top to bottom around the IC device 1020). With 4 bits, for example, the bit-encoded output may have any one of $16=2^4$ possible values n, ranging from the logical or binary "0000" (corresponding to n=0) to the logical or binary "1111" (corresponding to n=15). Each value of n may correspond to a predetermined or preselected signal, such as, "The core voltage requirement for this IC microprocessor is (n+1)(0.3125) volts," being output from the VID output pins of the interface cartridge of the IC microprocessor to the VID input pins of the voltage regulator circuit regulating the voltage input to the IC microprocessor, for example. If n=15 (corresponding to the logical or binary "1111"), for example, the associated bit-encoded output may correspond to the predetermined or preselected signal, "The core voltage requirement for this IC microprocessor is 5.0000=(16)(0.3125) volts," being output from the VID output pins of the interface cartridge.

The interface cartridge 1000 generates, through the reference voltage contacts 1055, the bit-encoded output that is output to the circuit device 1040, such as the logical or binary "1111" as shown in FIG. 10. The bit-encoded output leads to a predetermined or preselected response from the circuit device 1040, such as a voltage regulator response from a voltage regulator circuit for an IC microprocessor, for example. The response may be output from any one of the M+N+P+Q pins or leads or contacts 1090 of the circuit device 1040 and may be input to any one of the M+N+P+Q pins or leads or contacts 1095 of the IC device 1020.

Programmable jumpers 1080 are connected between the respective connections 1050 and 1060 of the interface cartridge 1000. The programmable jumpers 1080 may be electrical antifuse components soldered down on the interface cartridge 1000 substrate during the manufacturing process. For example, the programmable jumpers 1080 may be similar in size and shape to surface mount 0603 body resistors and capacitors. No special equipment may be needed to handle such a programmable jumper 1080. The programmable jumpers 1080 may be designed into the substrate of the interface cartridge 1000 in the same manner as surface mount resistors, such as surface mount 0603 body resistors, for example. Such programmable jumpers 1080, as electrical antifuse components, may inhibit or prevent electrical connections between the respective connections 1050 and 1060, much like having breaks in the circuits would, if the breaks in the circuits were between the respective connections 1050 and 1060, for example.

Figure 11:
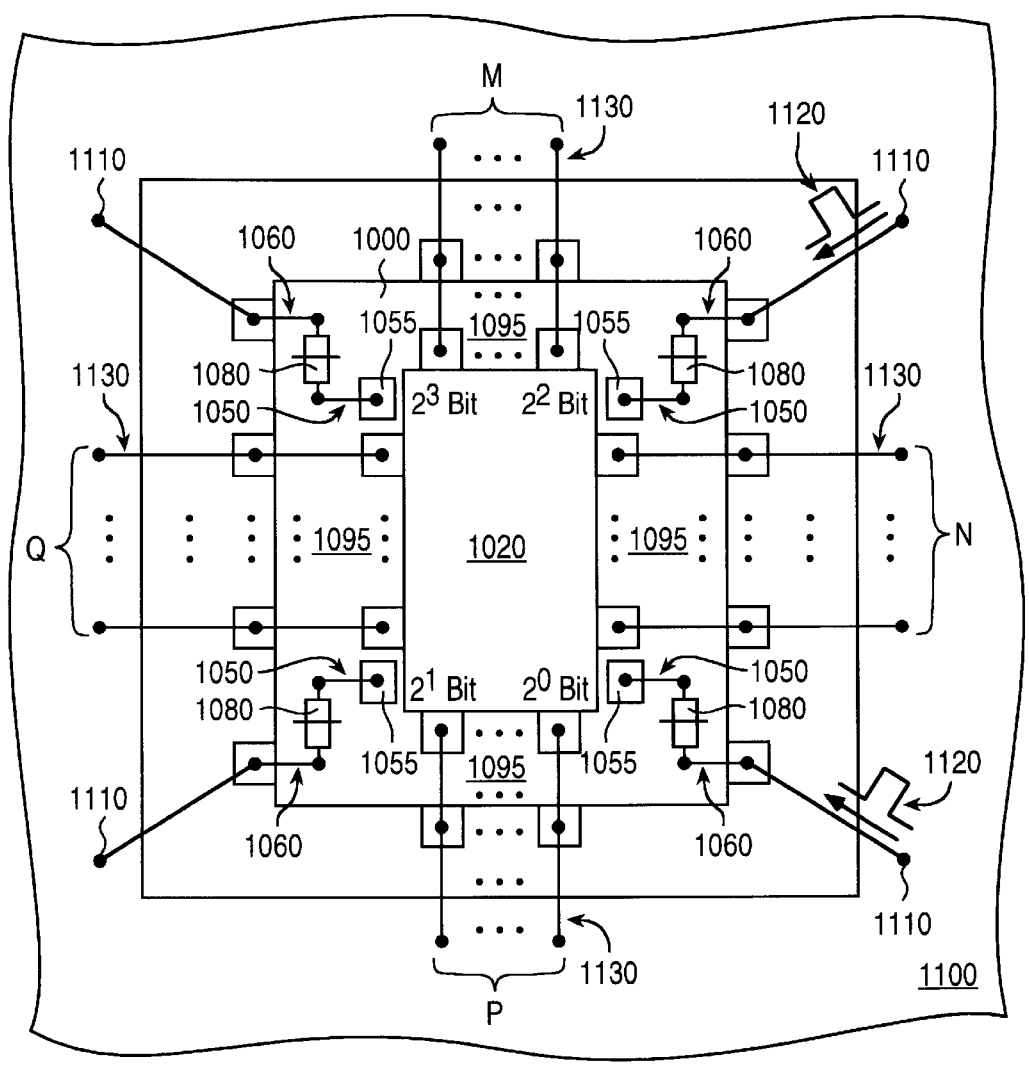
FIG. 11 is a schematic illustration of programming for the fourth embodiment as shown in FIG. 10, according to the present invention.

Turning now to FIG. 11, a schematic illustration is shown of the programming for the first embodiment as shown in FIG. 10, according to the present invention. The connection 1060 of the interface cartridge 1000 is connected to a testing circuit 1100 through a pin or lead or contact 1110, as shown in FIG. 11. In order to program the programmable jumpers 1080 of the interface cartridge 1000, if the bit-encoded output generated by the IC device 1020 is to be changed from the logical or binary "1111" as shown in FIG. 10, appropriate current pulses 1120 are output from the testing circuit 1100 through the contacts 1110, as indicated schematically by the arrows in FIG. 11. Provided the current pulses 1120 are sufficiently high in magnitude and sufficiently long in duration, the antifuse components of the programmable jumpers 1080 establish or close the circuits, and the programmable jumpers 1080 are in the state corresponding to a bit-encoded output of a logical or binary "1010" as indicated schematically in FIG. 12 (reading from left to right and from top to bottom around the IC device 1020). For example, a current about twice as large as the current-creating value of the programmable jumpers 1080 may suffice. The testing circuit 1100 may also be connected to the IC device 1020 through the M+N+P+Q pins or leads or contacts 1130 to respective ones of the M+N+P+Q pins or leads or contacts 1095 of the IC device, as shown in FIG. 11.

Figure 12:
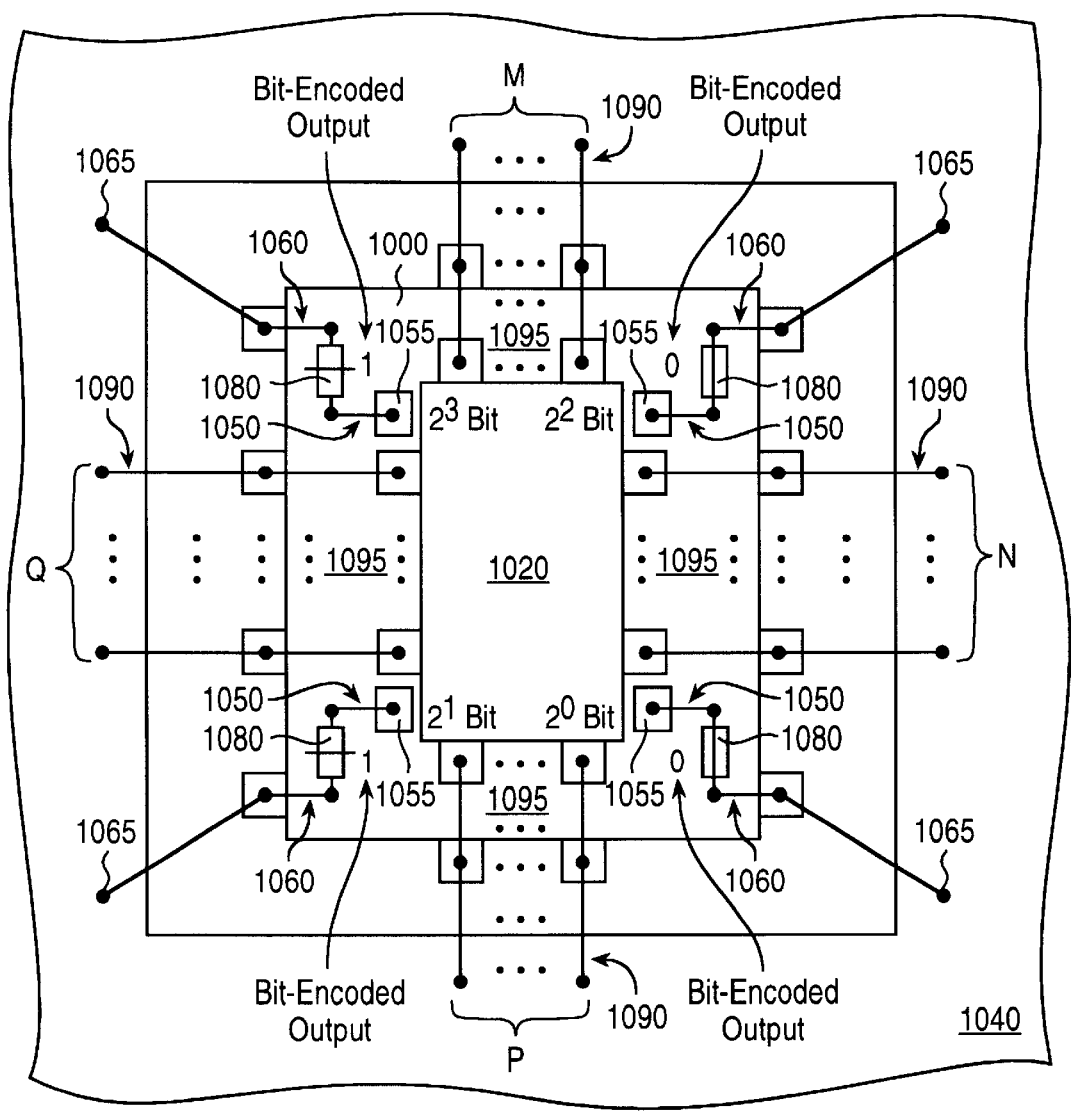
FIG. 12 is a schematic illustration of one possible outcome for the fourth embodiment as shown in FIG. 10, following the programming as shown in FIG. 11.

The antifuising in the programmable jumpers 1080 as shown in FIG. 12 close the circuits connecting the input contacts 1065 of the circuit device 1040, through the corresponding connections 1060 of the interface cartridge 1000, to the respective reference voltage contacts 1055 of the interface cartridge 1000, through the associated connections 1050 of the interface cartridge 1000. The closings of the circuits correspond to the respective bit-encoded output, such as the logical or binary "1010" (corresponding to n=10) as shown in FIG. 12. As discussed above, each value of n may correspond to a predetermined or preselected signal, such as, "The core voltage requirement for this IC microprocessor is (n+1)(0.3125) volts," being output from the VID output pins of the interface cartridge of the IC microprocessor to the VID input pins of the voltage regulator circuit regulating the voltage input to the IC microprocessor, for example. If n=10 (corresponding to the logical or binary "1010"), for example, the associated bit-encoded output may correspond to the predetermined or preselected signal, "The core voltage requirement for this IC microprocessor is 3.4375=(11)(0.3125) volts," being output from the VID output pins of the interface cartridge.

If the bit-encoded output generated by the IC device 1020 is not to be changed from the logical or binary "1111" (corresponding to n=15) as shown in FIG. 10, current pulses 1120 may still be output from the testing circuit 1100 through the respective contacts 1110, as indicated schematically by the arrows in FIG. 11. Provided the current pulses 1120 are sufficiently low in magnitude and sufficiently short in duration, the antifuse components of the programmable jumpers 1080 may not establish or close the circuits, and the programmable jumpers 1080 may remain in the state corresponding to the bit-encoded output of a logical or binary "1111" (corresponding to n=15) as indicated schematically in FIG. 10. For example, a current less than about half the current-creating value of the programmable jumpers 1080 may suffice.

Alternatively, in order to program the programmable jumpers 1080 of the interface cartridge 1000, if the bit-encoded output generated by the IC device 1020 is not to be changed from the logical or binary "1111" (corresponding to n=15) as shown in FIG. 10, current pulses 1120 may not need to be output from the testing circuit 1100 through the contacts 1110. In either case, if the current pulses 1120 output from the testing circuit 1100 are sufficiently low in magnitude and sufficiently short in duration or if no current pulses 1120 are output from the testing circuit 1100, the programmable jumpers 1080, as electrical antifuse components, may continue inhibiting or preventing electrical connections between the respective connections 1050 and 1060, much like having breaks in the circuits would, if the breaks in the circuits were between the respective connections 1050 and 1060, for example.

By using electrically programmable jumpers on interface cartridges, as in the above-described embodiments, rather than using manually programmable 0 Ω resistors, IC devices such as IC mobile microprocessors (for example, the Intel® Pentium®II microprocessors) may be manufactured using the same bill of materials (BOM), part number and assembly and test processes, regardless of the core voltages of the IC microprocessors. At the end of the testing, the programmable jumpers may be electrically programmed for the appropriate voltage ID (VID) value. This electrical programming may be an automated process performed just before the IC device and interface cartridge are removed from the testing circuit fixture. No change in the overall manufacturing process or flow may be needed in the event of an IC microprocessor core voltage change.

The ability to set the appropriate VID after testing for the optimal IC microprocessor core voltage is provided by embodiments of the present invention without requiring any reworking or any "stuffing" or any additional soldering, reducing the cost and complexity of the overall manufacturing process and increasing the throughput of the IC microprocessor, for example. By contrast, if the IC microprocessor's associated interface cartridge used conventional manually programmable 0 Ω resistors to define the VID bits, the 0 Ω resistors would have to be stuffed or modified and soldered or removed after testing for the optimal IC microprocessor core voltage, adding considerably to the cost and complexity of the manufacturing process and reducing throughput.

Over the life of an IC microprocessor, for example, the flexibility provided by the use of electrically programmable jumpers, according to embodiments of the present invention, rather than using conventional manually programmable 0 Ω resistors, may reduce manufacturing costs associated with the IC microprocessor since new assemblies may not be required when the core voltage requirements of the IC microprocessor change over time. The flexibility provided by the use of electrically programmable jumpers, according to embodiments of the present invention, rather than using conventional manually programmable 0 Ω resistors, may provide the ability to fine-tune the performance of the IC microprocessor's mobile interface cartridge at the end of a test cycle by setting the VID value for the optimum value for either power savings (important to mobile users with limited battery power, for example) or high-performance.

The above-described embodiments are illustrative and should not be considered as limiting the scope of the present invention. For example, electrically programmable jumpers, according to alternative embodiments of the present invention, may be used with any IC device generating a bit-encoded output that is fixed for a given version of the IC device, but that may need to change as the IC device is revised.

What is claimed is:

1. A programmable interface between an integrated circuit and a circuit device comprising:
   a reference contact to couple to a voltage or ground contact of the integrated circuit;
   an interface contact to couple to the circuit device; and
   a programmable jumper coupled between said reference contact and said interface contact, said programmable jumper having a state which is set by applying a programming signal to the programmable jumper, wherein the state of said programmable jumper subsequently indicates whether a closed or an open connection exists between said two contacts to control an encoded signal to the circuit device;
   wherein the encoded signal indicates to the circuit device a parameter of the integrated circuit.

2. The programmable interface of claim 1, wherein said programmable jumper is programmed with a current pulse impressed at said interface contact.

3. The programmable interface of claim 2, wherein said programmable jumper includes a fusible component which is blown to provide an open circuit between said two contacts.

4. The programmable interface of claim 2, wherein the current pulse has a current value of about twice that of a rated current-carrying capacity for said programmable jumper.

5. The programmable interface of claim 2, wherein said programmable jumper includes an antifuse component which is shorted to provide a short circuit between said two contacts.

6. A programmable interface coupled between an integrated circuit and a circuit device comprising:
   a reference contact to couple to a voltage or ground contact of the integrated circuit;
   an interface contact to couple to the circuit device; and
   a programmable jumper coupled between said reference contact and said interface contact, said programmable jumper having a state which is set by applying a programming signal to the programmable jumper, wherein the state of said programmable jumper subsequently indicates whether a closed or an open connection exists between said two contacts to control an encoded signal to the circuit device;
   wherein the encoded signal indicates to the circuit device a parameter of the integrated circuit.

7. The programmable interface of claim 6, wherein said programmable jumper is programmed with a current pulse impressed at said interface contact.

8. The programmable interface of claim 7, wherein said programmable jumper includes an electrically fusible component which is blown to provide an open circuit between said two contacts.

9. The programmable interface of claim 7, wherein said programmable jumper includes an electrical antifuse component which is shorted to provide a short circuit between said two contacts.

10. An apparatus comprising:
    an integrated circuit;
    a circuit device; and
    a programmable interface coupled between said integrated circuit and said circuit device to generate an encoded signal to said circuit device to set a circuit parameter applied to said integrated circuit from said circuit device, said programmable interface comprising:

a reference contact to couple to a voltage or ground contact of said integrated circuit;

an interface contact to couple to said circuit device; and a programmable jumper coupled between said reference contact and said interface contact, said programmable jumper having a state which is set by applying a programming signal to the programmable jumper, wherein the state of said programmable jumper subsequently indicates whether a closed or an open connection exists between said two contacts to control the encoded signal to the circuit device;

wherein the encoded signal indicates to the circuit device a parameter of the integrated circuit.

11. The apparatus of claim 10, wherein said programmable jumper is programmed with a current pulse impressed at said interface contact.

12. The apparatus of claim 11, wherein said programmable jumper includes an electrically fusible component which is blown to provide an open circuit between said two contacts.

13. The apparatus of claim 11, wherein said programmable jumper includes an electrical antifuse component which is shorted to provide a short circuit between said two contacts.

14. A method of providing a programmable jumper coupled between a terminal of an integrated circuit and a terminal of circuit device, comprising:

placing the programmable jumper between the two terminals; and programming the programmable jumper to create a state of the programmable jumper indicating whether a closed or an open connection exists between the two terminals to control an encoded signal to the circuit device;

wherein the encoded signal indicates to the circuit device a parameter of the integrated circuit.

15. The method of claim 14, wherein said programming includes inputting a current pulse of a predetermined value to set the state of the programmable jumper.

16. The method of claim 15, wherein said programmable jumper is programmed by inputting a current pulse to open circuit the programmable jumper.

17. The method of claim 15, wherein said current pulse is about twice as much as a current-carrying capacity of said programmable jumper.

18. The method of claim 15, wherein said programmable jumper is programmed by inputting a current pulse to short circuit the programmable jumper.

19. A method of providing a programmable jumper coupled between a terminal of an integrated circuit and a terminal of a circuit device comprising:

placing the programmable jumper between the two terminals; and programming the programmable jumper to create a state of the programmable jumper indicating whether a closed or an open connection exists between the two terminals to control an encoded signal to the circuit device;

wherein the encoded signal indicates to the circuit device a parameter of the integrated circuit.

20. The method of claim 19, wherein said programming includes inputting a current pulse of a predetermined value to set the state of the programmable jumper.

21. The method of claim 20, wherein said programmable jumper is programmed by inputting a current pulse to open circuit the programmable jumper.

22. The method of claim 20, wherein said programmable jumper is programmed by inputting a current pulse to short circuit the programmable jumper.

* * * * *

UNITED STATES PATENT AND TRADEMARK OFFICE
CERTIFICATE OF CORRECTION

PATENT NO.    : 6,229,378 B1  Page 1 of 1
DATED         : May 8, 2001
INVENTOR(S)   : Gourley et al.

It is certified that error appears in the above-identified patent and that said Letters Patent is hereby corrected as shown below:

Column 1,
Line 29, delete "$2_4$", insert -- $2^4$ --.

Signed and Sealed this

Fourth Day of June, 2002

Attest:

JAMES E. ROGAN
Attesting Officer    Director of the United States Patent and Trademark Office